United States Patent
Tian et al.

(10) Patent No.: US 9,897,634 B2
(45) Date of Patent: Feb. 20, 2018

(54) SLIDING WINDOW ENERGY DETECTION FOR SPECTRUM SENSING UNDER LOW SNR CONDITIONS

(71) Applicant: Intelligent Fusion Technology, Inc, Germantown, MD (US)

(72) Inventors: Xin Tian, Germantown, MD (US); Genshe Chen, Germantown, MD (US); Dan Shen, Germantown, MD (US); Zhi Tian, Fairfax, VA (US); Khanh D. Pham, Kirtland AFB, NM (US); Erik Blasch, Rome, NY (US)

(73) Assignee: INTELLIGENT FUSION TECHNOLOGY, INC., Germantown, MD (US)

( * ) Notice: Subject to any disclaimer, the term of this patent is extended or adjusted under 35 U.S.C. 154(b) by 695 days.

(21) Appl. No.: 14/506,605

(22) Filed: Oct. 4, 2014

(65) Prior Publication Data

US 2017/0299641 A1  Oct. 19, 2017

(51) Int. Cl.
- *G01R 23/16* (2006.01)
- *G08B 29/16* (2006.01)
- *G08B 29/18* (2006.01)

(52) U.S. Cl.
CPC ........... *G01R 23/16* (2013.01); *G08B 29/185* (2013.01)

(58) Field of Classification Search
CPC .................................................. G08B 29/185
See application file for complete search history.

(56) References Cited

U.S. PATENT DOCUMENTS

| | | | |
|---|---|---|---|
| 2003/0179727 A1* | 9/2003 | Soong ................ | H04W 52/143 370/328 |
| 2011/0246411 A1* | 10/2011 | Laneman .................. | G06N 5/04 706/52 |
| 2012/0072151 A1* | 3/2012 | Chen .................... | H04B 17/327 702/69 |

(Continued)

OTHER PUBLICATIONS

F. F. Digham, M-S. Alouini, and M. K. Simon, "On the Energy Detection of Unknown Signals over Fading Channels," IEEE International Conference on Communications, pp. 3575-3579, May 2003.

(Continued)

*Primary Examiner* — David Porta
*Assistant Examiner* — Jeremy S Valentiner
(74) *Attorney, Agent, or Firm* — Anova Law Group, PLLC (57) ABSTRACT

Methods and devices for spectrum sensing using sliding window energy detection are provided. A sliding window energy detection test having a number of continuously-performed tests can be analyzed according to a desired cumulative false alarm rate to provide a corresponding, testing threshold. Based on the testing threshold and target signal to noise ratio, a testing window length is selected such that the sliding window energy detection is performed for a minimum expected discrete detection time. A sliding window energy detector can then obtain the selected testing window length and the corresponding, testing threshold for spectrum sensing. The sliding window energy detector includes a sampling unit, a detection probability analyzer, a testing statistic generator, a false alarm analyzer, a comparing unit, and a declaring unit.

20 Claims, 7 Drawing Sheets

(56) References Cited

U.S. PATENT DOCUMENTS

2017/0126445 A1* 5/2017 Hamouda ........... H04L 27/0006

OTHER PUBLICATIONS

V. I. Kostylev, "Energy detection of a signal with random amplitude," Proc. IEEE ICC, pp. 1606-1610, Jun. 2002.
S. Gezici, Z. Sahinoglu, and H. V. Poor, "On the optimality of equal gain combining for energy detection of unknown signals," IEEE Commun. Lett., vol. 10, No. 11, pp. 772-774, Nov. 2006.
J. Boksiner; and S. Dehnie, "Comparison of Energy Detection using Averaging and Maximum Values Detection for Dynamic Spectrum Access," Proc. 34th IEEE Sarnoff Symposium, Jun. 16, 2011.

* cited by examiner

SLIDING WINDOW ENERGY DETECTION FOR SPECTRUM SENSING UNDER LOW SNR CONDITIONS

GOVERNMENT RIGHTS

This invention was made with Government support under Contract No. FA9453-11-1-0290 and FA9453-12-M-0022 awarded by the United States Air Force. The U.S. Government has certain rights in this invention.

DESCRIPTION OF THE DISCLOSURE

The present disclosure relates to the field of spectrum sensing and, more particularly, relates to methods and devices for spectrum sensing using sliding window energy detection.

BACKGROUND

Energy detection is often used for spectrum sensing, applicable for cognitive radio systems, spectrum access, and resource communication management. Spectrum sensing using energy detection provides low complexity and rapid analysis, and requires no knowledge of transmission signal characteristics. The design and performance analysis of energy detection has been addressed under the assumption that the detection tests must be all independent. However, for energy detections conducted in a sliding window fashion, correlations among the detection tests need to be considered for evaluation of false alarm rates and detection probabilities for energy detections.

Thus, there is a need to overcome these and other problems of the prior art and to provide methods and devices for spectrum sensing using sliding window energy detection with correlated test statistics.

BRIEF SUMMARY OF THE DISCLOSURE

One aspect or embodiment of the present disclosure includes a method for spectrum sensing using sliding window energy detection. A desired cumulative false alarm rate is obtained for a sliding window energy detection test. The sliding window energy detection test has a number of continuously-performed tests. A single-time false alarm rate for the sliding window energy detection test is determined from the desired cumulative false alarm rate. Based on a mapping relationship between the single-time false alarm rate for the sliding window energy detection test and a false alarm rate for an independent energy detection test under a condition with a same threshold and a same window length, the false alarm rate for the independent energy detection test corresponding to the single-time false alarm rate for the sliding window energy detection test can be determined. A testing threshold is obtained from the false alarm rate for the independent energy detection test. The obtained testing threshold yields the desired cumulative false alarm rate for the sliding window energy detection test.

Another aspect or embodiment of the present disclosure includes a method for spectrum sensing using a sliding window energy detector. In this method, a transmission signal is received using antennas of a channel sensor having a channel bandwidth. The transmission signal is sampled at a fixed sampling rate determined by the channel bandwidth. A testing window length corresponding to a minimum expected discrete detection time is obtained for a target signal to noise ratio for a sliding window energy detection test having a number of continuously-performed tests. Test statistic is generated according to the testing window length by a test statistic generator configured in the sliding window energy detector. A testing threshold corresponding to a desired cumulative false alarm rate is obtained for the sliding window energy detection test having the number of continuously-performed tests. The test statistic is then compared with the testing threshold. Detection is declared, when the test statistics is greater than the testing threshold. The sliding window energy detection process is performed having the minimum expected discrete detection time.

Another aspect or embodiment of the present disclosure includes a sliding window energy detector connected to a channel sensor for spectrum sensing. The sliding window energy detector includes a sampling unit, a detection probability analyzer, a testing statistic generator, a false alarm analyzer, a comparing unit, and a declaring unit.

The sampling unit is configured to sample a transmission signal from a channel sensor having a channel bandwidth at a fixed sampling rate determined by the channel bandwidth. The detection probability analyzer is configured to provide a testing window length corresponding to a minimum expected discrete detection time for a target signal to noise ratio for a sliding window energy detection test having a number of continuously-performed tests. The testing statistic generator is configured to generate test statistic according to the testing window length. The false alarm analyzer is configured to provide a testing threshold corresponding to a desired cumulative false alarm rate for the sliding window energy detection test having the number of continuously-performed tests. The comparing unit is configured to compare the test statistic with the testing threshold. The declaring unit is configured to declare detection when the test statistics is greater than the testing threshold. The sliding window energy detection process is performed having the minimum expected discrete detection time.

Additional objects and advantages of the disclosure will be set forth in part in the description which follows, and in part will be obvious from the description, or may be learned by practice of the disclosure. The objects and advantages of the disclosure will be realized and attained by means of the elements and combinations particularly pointed out in the appended claims.

It is to be understood that both the foregoing general description and the following detailed description are exemplary and explanatory only and are not restrictive of the disclosure, as claimed.

BRIEF DESCRIPTION OF THE DRAWINGS

The accompanying drawings, which are incorporated in and constitute a part of this specification, illustrate several embodiments of the disclosure and together with the description, serve to explain the principles of the disclosure.

DETAILED DESCRIPTION

Reference will now be made in detail to exemplary embodiments of the disclosure, an example of which is illustrated in the accompanying drawings. Wherever possible, the same reference numbers will be used throughout the drawings to refer to the same or like parts. In the following description, reference is made to the accompanying drawings that form a part thereof, and in which is shown by way of illustration specific exemplary embodiments in which the disclosure may be practiced. These embodiments are described in sufficient detail to enable those skilled in the art to practice the disclosure and it is to be understood that other embodiments may be utilized and that changes may be made without departing from the scope of the disclosure. The following description is, therefore, merely exemplary.

Methods and devices for spectrum sensing using sliding window energy detection are provided. In an exemplary embodiment, false alarm rate and detection probability of the sliding window energy detection are evaluated. Impact of window lengths (or discrete window lengths) on a discrete detection time are illustrated, when energy detection test is performed during a transition between a status $H_0$ (with no transmission signal) and a status $H_1$ (with transmission signal), under $H_0$, and/or under $H_1$. For example, when under $H_0$, the false alarm rate can be used for analysis and, when under $H_1$, the detection probability can be used for analysis.

Figure 1:
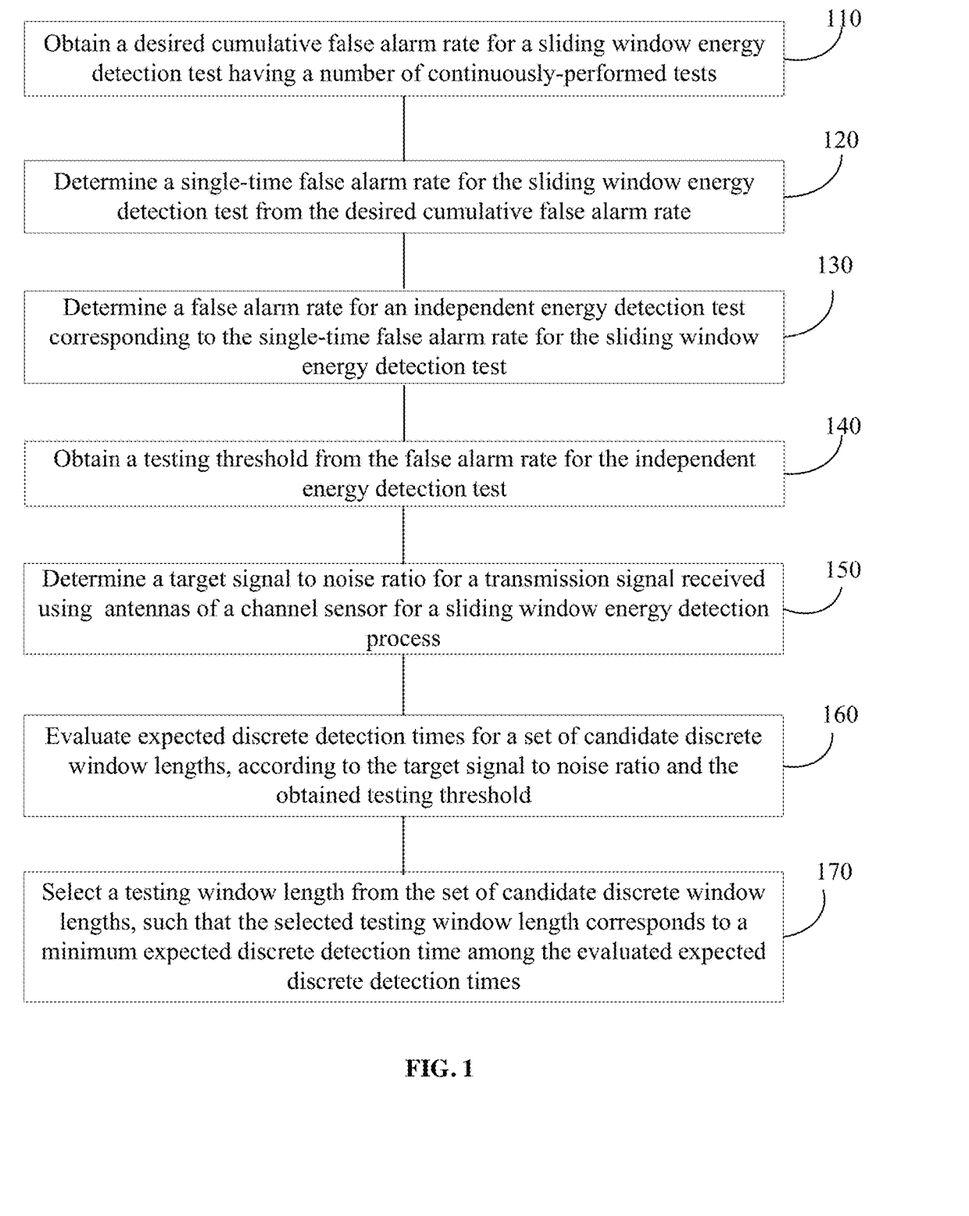
FIG. 1 depicts an exemplary method for spectrum sensing using sliding window energy detection consistent with various disclosed embodiments.

FIG. 1 depicts an exemplary method for spectrum sensing using sliding window energy detection consistent with various disclosed embodiments.

In Step 110, for spectrum sensing of a transmission signal using a sliding window energy detection test, a desired cumulative false alarm rate can be obtained for the sliding window energy detection test. The sliding window energy detection test can have a number of continuously-performed tests.

For example, a fixed sampling rate can be set based on a channel bandwidth W of a channel sensor of the transmission signal to provide a sampling interval, such that the continuously-performed tests of the sliding window energy detection test are performed at every sampling interval. With any testing window length of the continuously-performed tests greater than one sampling interval, consecutive testing windows can have overlap(s) for the sliding window energy detection test.

In Step 120, a single-time false alarm rate can be determined from the desired cumulative false alarm rate for the sliding window energy detection test.

In Step 130, based on a mapping relationship between the single-time false alarm rate for the sliding window energy detection test and a false alarm rate for an independent energy detection test under a condition with a same threshold and a same window length, the false alarm rate for the independent energy detection test corresponding to the single-time false alarm rate for the sliding window energy detection test can be determined.

For example, the mapping relationship between the single-time false alarm rate (under no transmission signal) for the sliding window energy detection test and the false alarm rate (under no transmission signal) for the independent energy detection test can be established under the condition with the same threshold and the same window length from a range of discrete window lengths.

In one embodiment, the mapping relationship can include a substantially-linear relationship between the single-time false alarm rate for the sliding window energy detection test and the false alarm rate for the independent energy detection test. For example, the single-time false alarm rate for the sliding window energy detection test is smaller than the false alarm rate for the independent energy detection test by a reduction factor ranging from 1 to about 0.1, due to correlation of test statistics in the sliding window energy detection test.

In Step 140, a testing threshold can be obtained from the false alarm rate for the independent energy detection test. The obtained testing threshold yields the desired cumulative false alarm rate for the sliding window energy detection test.

In Step 150, a target signal to noise ratio can be determined for the transmission signal received using antennas of a channel sensor for a sliding window energy detection process.

For example, the target signal to noise ratio can include unit time signal energy to noise spectrum density ratio, obtained by an analysis over parameters including a channel bandwidth for the transmission signal, a signal power, and a two-sided noise power spectrum density.

The sliding window energy detection process can be performed during a transition from a situation having no transmission signal to a situation having the transmission signal, and under the situation having the transmission signal.

In Step 160, expected discrete detection times can be evaluated for a set of candidate discrete window lengths, according to the target signal to noise ratio and the obtained testing threshold that yields the desired cumulative false alarm rate for the sliding window energy detection test.

Optionally, detection probabilities of the sliding window energy detection test can be determined at discrete times for each discrete window length of the set of candidate discrete window lengths, under the target signal to noise ratio and the obtained testing threshold corresponding to the desired cumulative false alarm rate for the sliding window energy detection test. In one example, for each candidate window length, after the transition from the situation having no transmission signal to the situation having the transmission signal, the detection probabilities increase as a signal-containing portion in a discrete testing window increases, and the detection probability reaches a peak value when the signal-containing portion fills a corresponding discrete window length.

In one embodiment, after reaching a peak detection probability in one test of a sliding window energy detection test, the detection probability of a following test of the one test can drop by an amount according to a correlation between the one test and the following test in the sliding window energy detection test.

In Step 170, a testing window length can be selected from the set of candidate discrete window lengths, such that the selected testing window length corresponds to a minimum expected discrete detection time among the evaluated expected discrete detection times.

Optionally, a relationship between the expected discrete detection time and the candidate discrete window length can be established under the target signal to noise ratio and the obtained testing threshold corresponding to the desired cumulative false alarm rate for the sliding window energy detection test. Based on the established relationship, the testing window length corresponding to the minimum expected discrete detection time can be selected.

Figure 2:
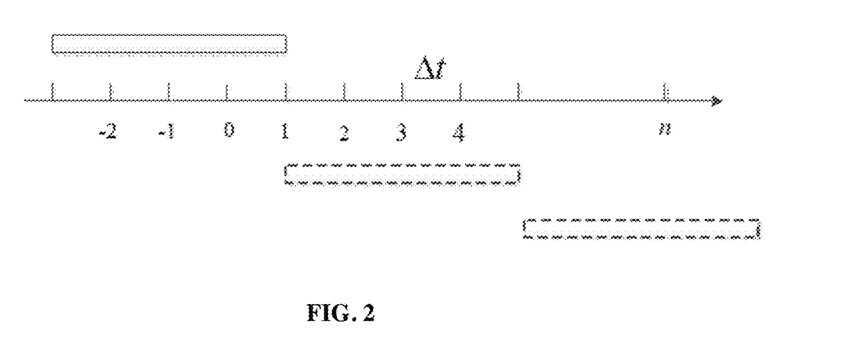
FIG. 2 is a schematic illustrating independent energy detection test consistent with various disclosed embodiments.
Figure 3:
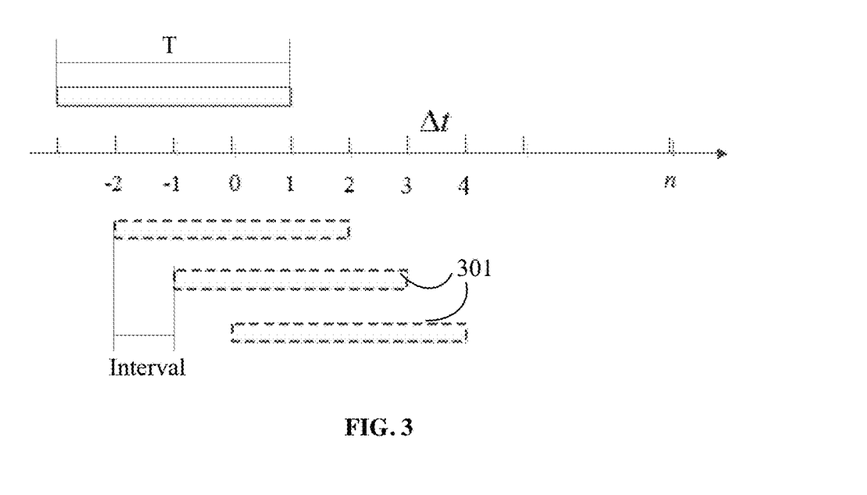
FIG. 3 is a schematic illustrating an exemplary sliding window energy detection test consistent with various disclosed embodiments.

FIG. 2 is a schematic illustrating independent energy detection test, while FIG. 3 is a schematic illustrating sliding window energy detection test consistent with various disclosed embodiments.

In independent energy detection tests for energy detections, a number of independent energy detection testing windows can be used for multiple detection tests each having an independent data set. The independent energy detection testing windows can be non-overlapping testing windows as shown in FIG. 2. Independent energy detection tests can thus only be performed at a rate limited by testing window length of the independent energy detection testing window. This, however, may cause performance degradation when energy detection is used to monitor a communication channel for detection of transmission signal activities.

For example, in some cases when a signal to noise ratio (SNR) at detector's receiver is low, a large testing window length should be particularly required. This may significantly increase detection time and degrade detection speed. In addition, with the testing rate related to the testing window length, it is difficult to conduct a fair performance comparison of multiple independent energy detection tests having different window lengths since the number of independent energy detection tests conducted over each given window length is different.

In FIG. 3, compared with the independent energy detection tests, sliding window energy detection tests can be performed having a fixed time interval ("interval") between consecutive tests (e.g., and thus the tests are dependent from one another), regardless of testing window length (T). The testing window length (T) may include a number of sampling intervals $\Delta t$, where $T = L \Delta t$, and L denotes a discrete window length. The sampling interval $\Delta t$ may be an inverse of a sampling rate.

Figure 7:
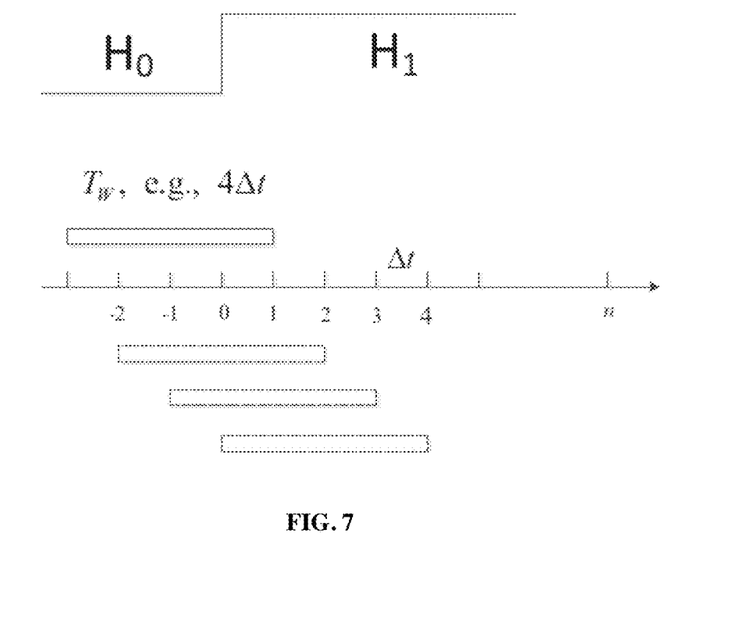
FIG. 7 depicts an exemplary detection process of a sliding window energy detection test consistent with various disclosed embodiments.

As shown in FIG. 3, consecutive testing windows 301 in a sliding window energy detection test can have overlaps there-between (also shown in FIG. 7). As a result, test statistics in the sliding window energy detection test can be correlated over time. Apparently, this correlation may significantly complicate the design and performance analysis of sliding window energy detection tests for spectrum sensing.

As disclosed herein, an effective approximation and a numerical method can be used to evaluate false alarm of the sliding window energy detection tests for energy detections of spectrum sensing. Interestingly, a substantially-linear relationship is found between the false alarm rates of the sliding window energy detection tests and the independent energy detection tests. Accordingly, sliding window energy detection tests for spectrum sensing can be designed and configured. As used herein, the terms "sliding window test" and "sliding window energy detection test" can be interchangeably used. The terms "independent window test" and "independent energy detection test" can be interchangeably used.

Detection probabilities of sliding window energy detection tests can be evaluated for a given SNR and any given testing window lengths. Corresponding distribution of the detection times (which corresponds to discrete times) is also obtained, which allows determination of an optimal window length ($L_o$) which provides minimum expected detection time.

Energy Detection by Independent Energy Detection Tests

A received waveform is often given by the following equation (eq.):

$$y(t) = \begin{cases} s(t) + n(t), & \text{under } H_1 \\ n(t), & \text{under } H_0 \end{cases} \quad (1)$$

where: $H_0$ denotes a situation that there is no transmission signal; $H_1$ denotes a situation that there is presence of transmission signal; n(t) denotes noise waveform assumed to be a zero-mean white Gaussian random process; and s(t) denotes signal waveform.

Baseband signals and passband signals are considered equivalent for a decision process. For convenience, the received signal is assumed to be at the baseband and has a limited bandwidth W. According to sampling theory, a noise process can be:

$$n(t) = \sum_{i=-\infty}^{\infty} n[i] \operatorname{sinc}(2Wt - i) \quad (2)$$

where: W denotes one-sided bandwidth in Herz (Hz), i.e., the positive bandwidth of the low-pass signal, and where $$\operatorname{sinc}(x) = \frac{\sin(\pi x)}{\pi x} \text{ and } n[i] = n\left(\frac{i}{2W}\right) = n(i\Delta t),$$

and n[i] is a discrete white noise random process (sampled from n(t) with sampling interval $$\Delta t = \frac{1}{2W}$$

with zero mean and variance $2N_0 W$ (where $N_0$ is two-sided noise power spectral density). For example, $$n[i] \sim N(0, 2N_0 W) \quad (3)$$

Similarly for the signal:

$$s(t) = \sum_{i=-\infty}^{\infty} s[i] \mathrm{sinc}(2Wt - i) \quad (4)$$

where: $s[i]=s(i\Delta t)$.

For a test using data in a time window [0 T], the test statistic V of the energy detection can be:

$$V = \frac{1}{N_0} \int_0^T y(t)^2 dt = \frac{1}{2WN_0} \sum_{i=1}^{2TW} y[i]^2 = \frac{1}{2WN_0} \sum_{i=1}^{L} y[i]^2 \quad (5)$$

where: $L=2TW=T/\Delta t$ is the window length in discrete time (i.e., discrete window length).

It can be easily seen that, under $H_0$:

$$\frac{y[i]}{\sqrt{2WN_0}} \sim N(0, 1) \quad (6)$$

and then:

$$V \sim \chi_L^2. \quad (7)$$

Under $H_1$:

$$\frac{y[i]}{\sqrt{2WN_0}} \sim N\left(\frac{s[i]}{\sqrt{2WN_0}}, 1\right) \quad (8)$$

and then:

$$V \sim \chi_L^2(\lambda), \quad (9)$$

where:

$$\lambda = \frac{1}{2WN_0} \sum_{i=1}^{L} s[i]^2 = \frac{1}{N_0} \int_0^T s(t)^2 dt = \frac{P_s T}{N_0} \quad (10)$$

where: $\lambda$ is the noncentrality parameter.

The probability density function (pdf) of the test statistic can be:

$$f_V(x) = \begin{cases} \frac{1}{2^{L/2}\Gamma(L/2)} x^{L/2-1} e^{-x/2}, & H_0 \\ \frac{1}{2} e^{-(x+\lambda)/2} \left(\frac{x}{\lambda}\right)^{L/4-1/2} I_{L/2-1}(\sqrt{\lambda x}), & H_1 \end{cases}, x \geq 0 \quad (11)$$

where: $\Gamma(L/2)$ denotes Gamma function, and $I_v(z)$ is a modified Bessel function of a first kind.

The probability of false alarm $P_f$ (under $H_0$) can be:

$$P_f = P(V > \tau | H_0) = 1 - \frac{\gamma(L/2, \tau/2)}{\Gamma(L/2)} \quad (12)$$

where: $\tau$ denotes a threshold used by energy detector, $\gamma(k, z)$ is the lower incomplete Gamma function, and:

$$P_d = P(V > \tau | H_1) = Q_{\frac{L}{2}}(\sqrt{\lambda}, \sqrt{\tau}) \quad (13)$$

where $Q_M(a, b)$ is the Marcum Q-function.

Note that the evaluations in equations (12) and (13) can only apply to energy tests that are independent. For the disclosed sliding window energy detection tests, test statistics of multiple tests are correlated and the above evaluations are no longer valid.

False Alarm Analysis for Energy Detection by Sliding Window Energy Detection Tests In sliding window energy detection tests, correlated test statistics can be used and the above-disclosed evaluations for independent energy detection tests are no longer valid for sliding window energy detection tests.

Window length of the sliding window energy detection test in discrete time is L (i.e., discrete window length L) and the sliding window energy detection tests are conducted at a discrete time [k], where k can be 1, 2, 3, etc. (e.g., in FIG. 3, k is −3, −2, −1, and 0).

Corresponding test statistics can be:

$$V[k] = \frac{1}{2WN_0} \sum_{i=k-L}^{1} y[i]^2 \Longleftrightarrow \frac{1}{N_0} \int_{(k-L)\Delta t}^{k\Delta t} y(t)^2 dt \quad (14)$$

When a test starts from k=1, under a situation of $H_0$, sliding window false alarm probabilities, $P_{fs}$, at discrete times k=1, 2, 3, and 4 for testing can be:

$$P_{fs}[1]=P(V[1]<\tau) \quad (15)$$

$$P_{fs}[2]=P(V[2]<\tau|V[1]\leq\tau) \quad (16)$$

$$P_{fs}[3]=P(V[3]>\tau|V[1]\leq\tau,V[2]\leq\tau) \quad (17)$$

$$P_{fs}[4]=P(V[4]>\tau|V[1]\leq\tau,V[2]\leq\tau), V[3]\leq\tau) \quad (18)$$

Although the evaluation of $P_{fs}[1]$ can follow eq. 12, exact evaluations of eq. (16)-(18) are increasingly more complicated. As such, the following approximation is used for evaluating false alarm rate $P_{FAs}$ in sliding window energy detection tests:

$$P_{fs}[k] \approx P(V[k]>\tau|V[k-1]\leq\tau)=P_{FAs} \quad (19)$$

Figure 4:
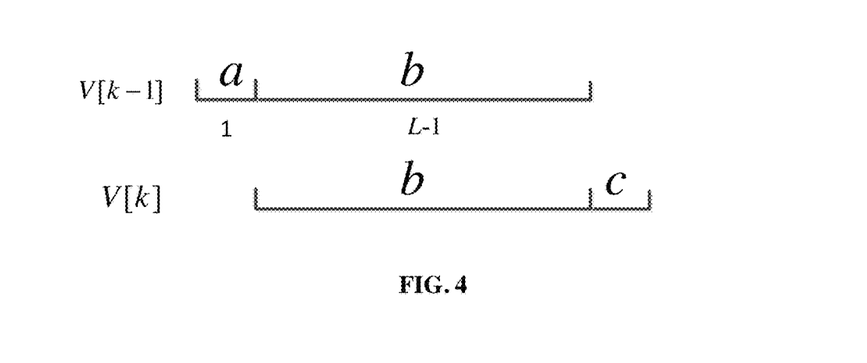
FIG. 4 depicts test statistics of two exemplary consecutive tests in a sliding window energy detection test consistent with various disclosed embodiments.

Equation (19) is conditioned only based on previous testing result that has the biggest impact on the current test at discrete time k. For example, FIG. 4 depicts correlated test statistics of two exemplary consecutive testing windows for consecutive tests in a sliding window energy detection test consistent with various disclosed embodiments.

For evaluation of eq. (19), FIG. 4 shows an exemplary relationship between two consecutive test statistics where $V_C^i[k-1]=a+b$ is the sum of two independent random variables a and b. Under $H_0$, one has $a \sim \chi_1^2$ and $b \sim \chi_{L-1}^2$, wherein $\chi_\alpha^2$ denotes chi-square distribution with $\alpha$ degrees of freedom; and $\chi_\alpha^2(\beta)$ denotes noncentral chi-square distribution with $\alpha$ degrees of freedom and noncentrality parameter $\beta$. $V_C^i[k]=b+c$ is the sum of b which is the common part (or overlapped part) with $V_C^i[k-1]$ and random variable c which follows $\chi_1^2$ and is independent from b and a.

To evaluate false alarm rate $P_{FAs}$, the posterior probability density function (pdf) of b conditioned on $V_C^i[k-1] \leq \tau$, denoted as $p_b(b|a+b \leq \tau)$, needs to be first evaluated. From Bayes' rule:

$$p(b|a+b \leq \tau) \propto p_b(b) \int_0^{\tau-b} p_a(a) da \qquad (20)$$

where: $p_a(\cdot)$ denotes the probability density function (pdf) for a; and $p_b(\cdot)$ is pdf for b. Then for the evaluation of eq. (19), the false alarm rate $P_{FAs}$ is as follows:

$$P_{FAs} = 1 - P(V[k] \leq \tau | V[k-1] \leq \tau) = 1 - \int_0^\tau [p_b(b|a+b \leq \tau) \int_0^{\tau-b} p_c(c) dc] db \qquad (21)$$

The direct evaluation of eq. (20) is known difficult. As disclosed herein, a numerical approach is used to evaluate eq. (20). Note that the posterior pdf (20) is non zero only over interval [0 τ], which allows use of a discrete approximation to accurately represent the pdf. To do this, the interval [0 τ] is evenly divided into N pieces whose probability masses are proportional to the probability density (20) at their center (sampling) points. The discrete approximation of $p_b(b|a+b \leq \tau)$ can be obtained as $$p_d[i|a+b \leq \tau] \propto p_b\left(\frac{\tau}{N}\left(i - \frac{1}{2}\right)\right) \int_0^{\frac{\tau}{N}\left(N-i-\frac{1}{2}\right)} p_a(a) da, \qquad (22)$$

$i = 1, \ldots, N$, and $$\sum_{i=1}^N p_b[i|a+b \leq \tau] = 1, \qquad (23)$$

To evaluate the false alarm rate $P_{FAs}$ in eq. (21) the following approximation is used:

$$\int_0^\tau \left[p_b(b|a+b \leq \tau) \int_0^{\tau-b} p_c(c) dc\right] db \approx \sum_{i=1}^N p_b[i|a+b \leq \tau] \int_0^{\frac{\tau}{N}\left(N-i-\frac{1}{2}\right)} p_c(d) dc \qquad (24)$$

Figure 5:
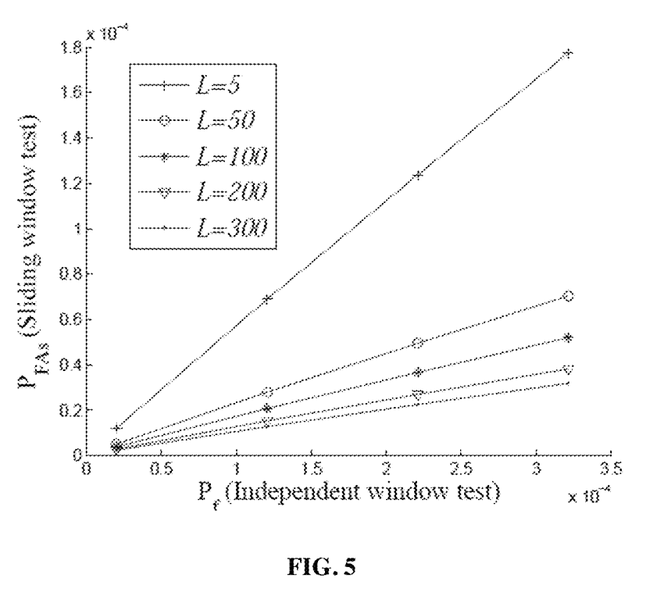
FIG. 5 depicts an exemplary mapping relationship between single-time false alarm rate $P_{FAs}$ for sliding window energy detection test and false alarm rate $P_f$ for independent energy detection test consistent with various disclosed embodiments.

From the approximation, any desired level of evaluation accuracy can be achieved by using a sufficiently large N. FIG. 5 depicts false alarm rate $P_{FAs}$ (eq. 21) for sliding window energy detection tests versus false alarm rate $P_f$ (eq. 12) for independent energy detection tests having a same set of discrete window lengths and under a same testing threshold τ for both cases.

As shown in FIG. 5, for the set of discrete window lengths considered L=5, 50, 100, 200, 300, $P_{FAs}$ for sliding window energy detection tests is smaller than $P_f$ for independent energy detection tests by a reduction factor ranging from 1 (no reduction, when the window length is 1) to approximately 0.1 (for long window lengths up to 300). This can be due to correlation of the test statistics in the sliding window energy detection tests. Interestingly, for a given window length, $P_f$ vs. $P_{FAs}$ may have a relationship that is substantially linear, which allows an easy mapping there-between to simplify design of sliding window energy detection test.

For the design of the sliding window energy detection test, a cumulative false alarm rate, denoted as $P_F(K)$, can be provided over a long period of K tests. The cumulative false alarm rate $P_F(K)$ is related to false alarm rate $P_{FAs}$ by:

$$P_F(K) = 1 - (1 - P_{FAs})^K \qquad (25)$$

A corresponding required false alarm rate $P_{FAs}$ for sliding window energy detection test is derived from eq. (25) as:

$$P_{FAs} = 1 - (1 - P_F(K))^{1/K} \qquad (26)$$

For example, for a required cumulative false alarm rate of $P_F(500) = 0.01$, where discrete time k=500, a required $P_{FAs}$ can be about $2.01 \times 10^{-5}$ calculated based on eq. (26).

Further, according to a mapping relationship between $P_f$ to $P_{FAs}$ for various window lengths of interest (as shown in FIG. 5), corresponding $P_f$ can be evaluated and desired test threshold τ can be obtained from eq. (12).

Figure 6:
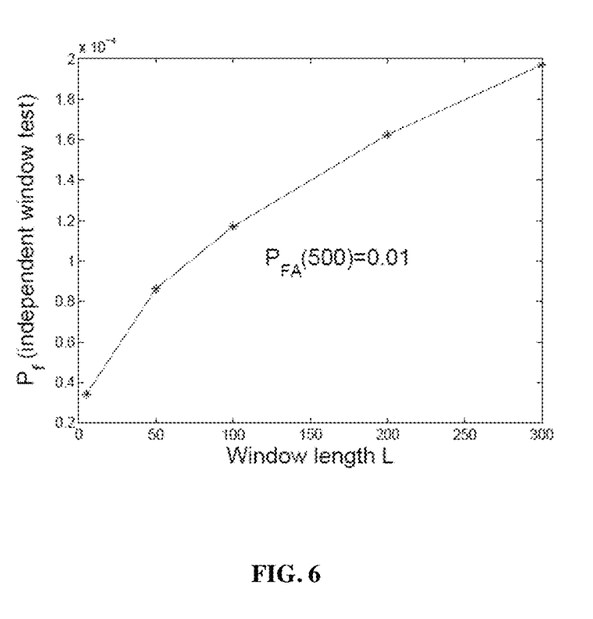
FIG. 6 depicts an exemplary relationship of false alarm rate $P_f$ of independent energy detection test versus discrete window length L consistent with various disclosed embodiments.

FIG. 6 depicts false alarm rate $P_f$ of independent energy detection tests versus discrete window length L when an exemplary cumulative false alarm rate $P_F(500) = 0.01$. It can be seen that under the same cumulative false alarm rate requirement for the sliding window energy detection tests, a larger window length L allows a higher false alarm rate $P_f$ of corresponding single independent energy detection test.

Detection Probability and Performance Analysis of Sliding Window Energy Detection Tests Most detection tests consider that transmission signal may exist under $H_1$ all the time during the tests. As disclosed herein, energy detection is performed during a transition between status $H_0$ (with no transmission signal) and status $H_1$ (with transmission signal) and under $H_1$. Impact of window length on detection performance is also illustrated.

FIG. 7 illustrates an exemplary detection process of a sliding window energy detection test consistent with various disclosed embodiments. In this example, the discrete sliding window length L=4, and the transition from $H_0$ to $H_1$ occurs at 0, as shown in FIG. 7. In this case, detection probabilities $P_{ds}$ of the sliding window energy detection test can be:

$$P_{ds}[1] = P(V[1] > \tau | V[0] \leq \tau, V[-1] \leq \tau, V[-2] \leq \tau) \qquad (27)$$

$$P_{ds}[2] = P(V[2] > \tau | V[1] \leq \tau, V[0] \leq \tau, V[-1] \leq \tau) \qquad (28)$$

$$P_{ds}[3] = P(V[3] > \tau | V[2] \leq \tau, V[1] \leq \tau, V[0] \leq \tau) \qquad (29)$$

where: the test statistics V[k] are from eq. (14) and the testing threshold τ is determined based on the requirement on the cumulative false alarm rate $P_F(K)$ for the sliding window energy detection test (e.g., from eq. 25) using the detection threshold design unit as discussed above (e.g., including eq. 14-26). Similarly as for the false alarm evaluation, exact evaluations of detection probabilities are complicated especially for long window lengths. Similarly, same approximation method as for the false alarm evaluation is also used for evaluation of detection probabilities in sliding window energy detection tests. For example:

$$P_{ds}[k] \approx P(V[k] > \tau | V[k-1] \leq \tau) = P_{Decs} \qquad (30)$$

Likewise, same/similar methods for evaluating false alarm of the sliding window energy detection test are used for evaluation of the detection probabilities. For example, two consecutive test statistics under $H_1$ may bear the same relationship as illustrated in FIG. 4. Similar to eq. (21) discussed above, detection probabilities $P_{Decs}$ can be:

$$P_{Decs} = 1 - P(V[k] \leq \tau | V[k-1] \leq \tau) = 1 - \int_0^\tau [p_b(b|a+b \leq \tau) \int_0^{\tau-b} p_c(c) dc] db \qquad (31)$$

Under the situation of $H_1$ having transmission signal, posterior density $p_b(b|a+b \leq \tau)$ can be evaluated under the condition that:

$$a \sim \chi_1^2(h\eta), h = 0, 1 \qquad (32)$$

where: h is 0, and when at (k−1), there is no signal exists in the first Δt portion of the testing window. Otherwise: h=1, and $$\eta = \frac{P_s \Delta t}{N_0} = \frac{P_s}{N_0 2W} \qquad (33)$$

where: $\eta$ is defined as the unit time signal energy to noise density ratio, Ps denotes signal power, and $N_0$ denotes two-sided noise power spectrum density. For the common part b of V[k−1] and V[k] (see FIG. 4):

$$b \sim \chi_{L-1}^2(m\eta), m=1,\ldots,L-1 \qquad (34)$$

where: m is determined by the number of $\Delta t$ when the signal exists (under $H_1$) in the b portion of the testing window as shown in FIG. 4. Under $H_1$, c follows $\chi_1^2(\eta)$. To evaluate eq. (31), the same numerical approach as in eq. (24) can be used.

Figure 8:
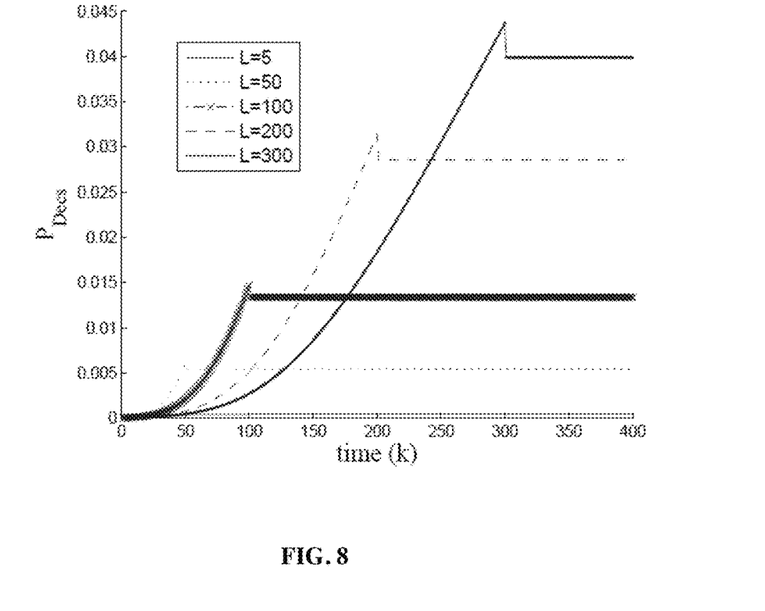
FIG. 8 depicts detection probability $P_{Decs}$ of an exemplary sliding window energy detection test versus discrete time k consistent with various disclosed embodiments.

FIG. 8 depicts detection probabilities $P_{Decs}$ of an exemplary sliding window energy detection test versus discrete time k, when the unit time signal noise ratio $\eta=0.4$ and the required cumulative false alarm rate $P_F(500)=0.01$. In this example, a transition from $H_0$ to $H_1$ occurs at time 0 (as shown in FIG. 7), detection probabilities $P_{Decs}$ of sliding window energy detection test are shown for a set of discrete window lengths (L=5, 50, 100, 200, and 300) having discrete testing times (or discrete times) k from 1 to 400.

As shown in FIG. 8, for any given window length, after the transition from $H_0$ to $H_1$, the detection probabilities $P_{Decs}$ increase as the signal-containing portion (corresponding to $H_1$) of the testing window increases. The detection probability $P_{Decs}$ reaches a peak value when the signal portion fills the whole discrete window length in the sliding window energy detection test. As the discrete window length increases, the peak detection probability of that sliding window energy detection test increases, however, the rate of the increase in detection probability decreases.

After reaching the peak detection probability in a certain sliding window energy detection test, the detection probabilities of following tests drop a certain amount due to correlations between the consecutive tests in the sliding window energy detection test. It can be seen that different window lengths have different tradeoffs between the speed of the detection and the achievable detection probability.

Figure 9:
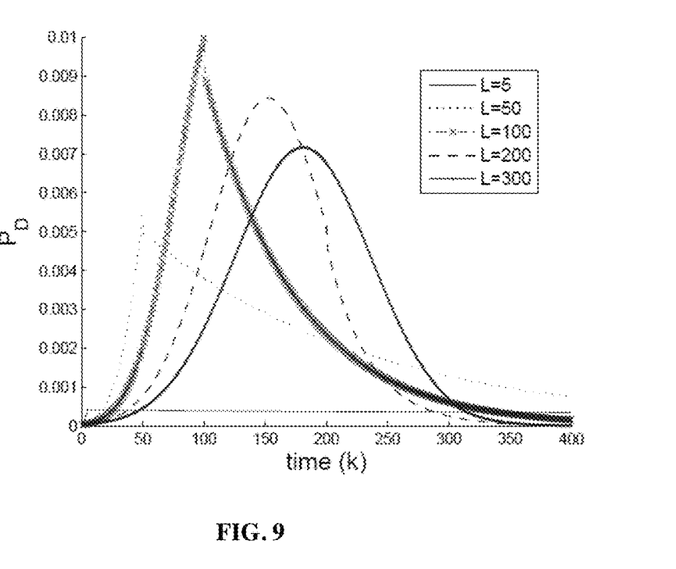
FIG. 9 depicts an exemplary probability mass function of discrete detection time for different window lengths consistent with various disclosed embodiments.

FIG. 9 depicts an exemplary probability mass function of discrete detection time for the set of window lengths, when the unit time signal noise ratio $\eta=0.4$ and the required cumulative false alarm rate $P_F(500)=0.01$. FIG. 9 shows distributions of discrete detection time for each of different window lengths considered over a time period of 400 testing times. The probability mass function of discrete detection time is obtained from $P_{Decs}$ of eq. (31) by:

$$P_D(k) = \prod_{i=1}^{k-1}(1 - P_{Decs}(i))P_{Decs}(k) \qquad (35)$$

Figure 10:
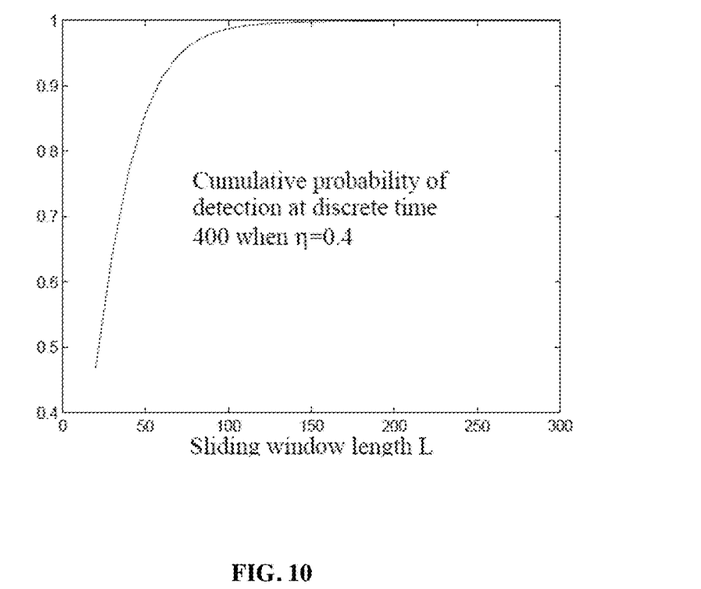
FIG. 10 depicts an exemplary cumulative probability of detection at discrete time 400 consistent with various disclosed embodiments.

For window lengths ranging from 20 to 300, FIG. 10 shows cumulative probabilities of detection at end of the testing period of discrete time 400, when the unit time signal noise ratio $\eta=0.4$ and the required cumulative false alarm rate $P_F(500)=0.01$.

Figure 11:
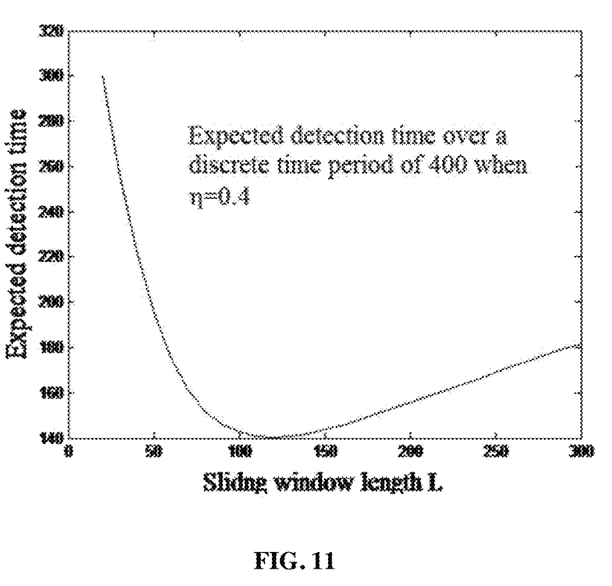
FIG. 11 depicts an exemplary expected detection time over a discrete time period of 400 consistent with various disclosed embodiments.

FIG. 11 shows expected detection time corresponding to FIG. 10. Note that when there is no detection during the testing (which occurs quite often with small window lengths, as indicated in FIG. 10) the detection time is counted as 400. As shown, for a given unit time signal to noise ratio, the expected time versus sliding window length takes a convex curve. When $\eta=0.4$ and $P_F(500)=0.01$, the optimal window length (Lo) for the sliding window energy detection, which minimizes the expected detection time, is Lm=120, in this example as shown in FIG. 11.

Similar detection performance analysis of the sliding window energy detection tests can be conducted for different levels of unit time signal energy to noise spectrum density ratio ($\eta$). The performance analysis of the sliding window energy detection is conducted considering the detector side unit time signal to noise density ratio $\eta$ is known. In practice, when $\eta$ is not known exactly, the analysis needs to be conducted over the range of parameters of interest (e.g., see eq. 33) for the selection of an appropriate testing window length.

In this manner, methods for spectrum sensing for sliding window energy detection is analyzed, designed, predicted, and/or provided. The energy detection can be used to monitor a communication channel for the detection of signal transmission activities.

For example, a desired cumulative false alarm rate $P_F(K)$ for sliding window energy detection tests each having a number of continuously-performed tests can be obtained (Step 110 in FIG. 1). In one embodiment, a desired or required cumulative false alarm rate $P_F(500)=0.01$, where a discrete time k=500.

A fixed time interval can be set between consecutive tests (i.e., dependent from one another), regardless of the testing window length. The consecutive tests include consecutive testing windows having overlaps there-between. Based on the cumulative false alarm rate $P_F(K)$, a false alarm rate $P_{FAs}$ for the sliding window energy detection tests can be determine, e.g., according to eq. (25) (Step 120 in FIG. 1).

A mapping relationship (as shown in FIG. 5) between false alarm rate $P_{FAs}$ (under $H_0$) for sliding window energy detection tests and false alarm rate $P_f$ (under $H_0$) of independent energy detection tests under a set of discrete window lengths of interest can be established. Based on the mapping relationship and the false alarm rate $P_{FAs}$ for the sliding window energy detection test, the false alarm rate $P_f$ of the independent energy detection test can be determined (Step 130 in FIG. 1). The mapping relationship can include a substantially-linear relationship between false alarm rate $P_{FAs}$ (eq. 21) for sliding window energy detection tests and false alarm rate $P_f$ (eq. 12) for independent energy detection tests, e.g., having a same set of discrete window lengths.

In some cases, the false alarm rate $P_{FAs}$ for sliding window energy detection tests is smaller than false alarm rate $P_f$ for independent energy detection tests by a reduction factor ranging from 1 (no reduction, when the window length is 1) to approximately 0.1 (for long window lengths up to 300), due to correlation of test statistics in the sliding window energy detection tests. A desired testing threshold $\tau$ can be obtained from the determined false alarm rate $P_f$ of the independent energy detection tests, e.g., from eq. (12) (Step 140 in FIG. 1).

A target signal to noise ratio ($SNR_T$) of for a transmission signal received using antennas of a channel sensor for a detection process of the sliding window energy detection can be determined according to specific requirements (Step 150 in FIG. 1). The target signal to noise ratio can include a unit time signal energy to noise spectrum density ratio $\eta$. The detection process can be performed: during a transition from $H_0$ (with no transmission signal) to $H_1$ (with transmission signal), and under $H_1$ having the transmission signal.

Detection probabilities $P_{Decs}$ of the sliding window energy detection tests can be determined with respect to discrete time, under the target signal to noise ratio and the testing threshold corresponding to the cumulative false alarm rate for the sliding window energy detection tests, for example, when $\eta=0.4$ and $P_F(500)=0.01$ at each discrete window length (L) (as shown in FIG. 8.)

Wherein for each candidate window length, after the transition from $H_0$ to $H_1$, the detection probabilities $P_{D_{ecs}}$ increase as the signal-containing portion (corresponding to H1) of the testing window increases as shown in FIGS. 7-8. After the detection probability $P_{D_{ecs}}$ reaches a peak value when the signal portion fills a whole discrete window length in the sliding window energy detection test. After reaching the peak detection probability in a certain sliding window energy detection test, the detection probability of the following tests drop in an amount according to correlations between consecutive tests of a test and a following test in the sliding window energy detection test.

Expected discrete detection times for a set of candidate discrete window lengths (L) using a detection performance prediction unit, according to the target signal to noise ratio and the testing threshold corresponding to the cumulative false alarm rate for the sliding window energy detection tests (Step 160 in FIG. 1).

A testing window length can be selected from the set of candidate discrete window lengths such that the testing window length corresponds to a minimum expected discrete detection time from the evaluated expected discrete detection times (as shown in FIGS. 8-9) (Step 170 in FIG. 1).

In various embodiments, before selecting the testing window length, a relationship between expected detection time and the candidate discrete window length under certain target signal to noise ratio ($SNR_T$) and the testing threshold Tau (L) corresponds to (or) the desired cumulative false alarm rate $P_F(K)$ can be first determined (FIGS. 8-9).

Therefore, for the sliding window energy detection, the testing threshold and the testing window length $L_o$ can be designed and configured, e.g., respectively by a false alarm analyzer and a detection probability analyzer, for sliding window energy detections implemented by a sliding window energy detector for providing an expected discrete detection time.

Figure 12:
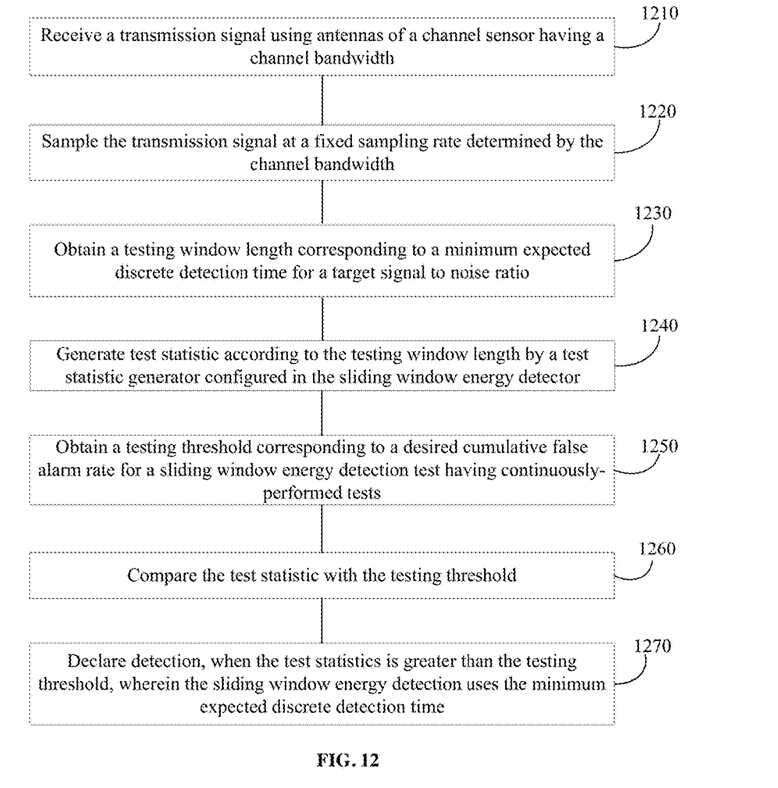
FIG. 12 depicts an exemplary method for spectrum sensing using a sliding window energy detector consistent with various disclosed embodiments.
Figure 13:
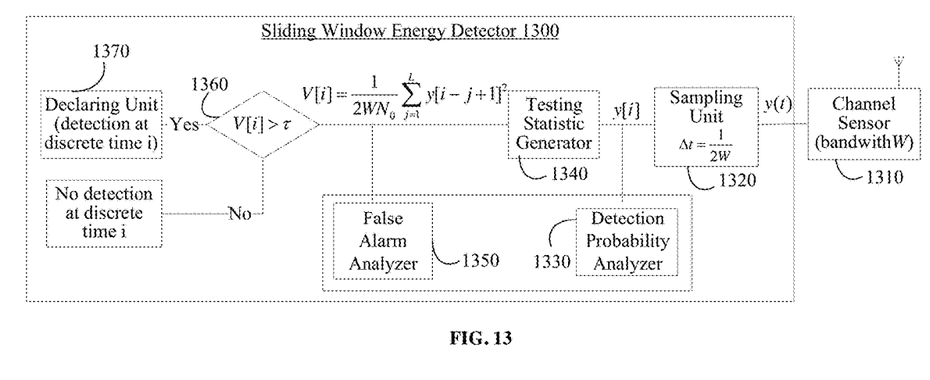
FIG. 13 depicts an exemplary method for using a sliding window energy detector consistent with various disclosed embodiments.

FIG. 12 depicts an exemplary method for spectrum sensing using a sliding window energy detector. Correspondingly, FIG. 13 depicts an exemplary sliding window energy detector 1300 connected to a channel sensor 1310 for spectrum sensing. For example, the exemplary sliding window energy detector 1300 may include a sampling unit 1320, a detection probability analyzer 1330, a testing statistic generator 1340, a false alarm analyzer 1350, a comparing unit 1360, and/or a declaring unit 1370 to implement the disclosed method in FIGS. 1 and/or 12.

In Step 1210 of FIG. 12, a transmission signal can be received using antennas of a channel sensor 1310 in FIG. 13 having a channel bandwidth W.

For example, the channel sensor 1310 can then provide transmission signal including passband signals. The passband signals can further be converted into baseband signals to generate baseband or low pass signal $y_{(t)}$ with bandwidth W. Such conversion can be performed by a conversion unit (not shown) configured inside or outside of the channel sensor 1310. The transmission signal can thus include converted low pass signal $y_{(t)}$, which is then sent to the sampling unit 1320 for sampling.

In Step 1220 of FIG. 12, the transmission signal can be sampled at a fixed sampling rate determined by the channel bandwidth using the sampling unit 1320 in FIG. 13. The sampling process can be similar or same as the sampling process as described above, e.g., in the method of FIG. 1.

For example, the fixed sampling rate can be set based on the channel bandwidth W to provide a sampling interval, such that the continuously-performed tests of the sliding window energy detection test are performed at every sampling interval. With any testing window length of the continuously-performed tests greater than one sampling interval, consecutive testing windows can have overlaps for the sliding window energy detection test.

In Step 1230 of FIG. 12, a testing window length L can be obtained from the detection probability analyzer 1330 of FIG. 13 corresponding to a minimum expected discrete detection time for a target signal to noise ratio. For example, the target signal to noise ratio can include unit time signal energy to noise spectrum density ratio $\eta$, obtained by an analysis over parameters including a channel bandwidth for the transmission signal, a signal power, and a two-sided noise power spectrum density (for example, according to eq. 33).

In one example, the testing window length L corresponding to the minimum expected discrete detection time can be obtained by performing a sliding window energy detection process during a transition from a situation having no transmission signal to a situation having the transmission signal, and under the situation having the transmission signal, e.g., by the detection probability analyzer 1330 of FIG. 13. In this case, a relationship between expected discrete detection time and candidate discrete window length can be first established under the target signal to noise ratio and the testing threshold corresponding to the desired cumulative false alarm rate for the sliding window energy detection test. Based on the established relationship, the testing window length can be selected according to the minimum expected discrete detection time.

In various embodiments, the detection probability analyzer 1330 of FIG. 13 can be configured to analyze the sliding window energy detection process to provide the testing window length L as described above. The detection probability analyzer 1330 can be configured within the testing statistic generator 1340 or outside of the testing statistic generator 1340. Alternatively, the detection probability analyzer 1330 can be configured within or outside of the sliding window energy detector 1300.

In Step 1240 of FIG. 12, test statistic can be generated by the testing statistic generator 1340 of FIG. 13 according to the testing window length L.

In Step 1250 of FIG. 12, a testing threshold $\tau$ corresponding to a desired cumulative false alarm rate can be obtained from the false alarm analyzer 1350 of FIG. 13 for a sliding window energy detection test. The false alarm analyzer 1350 can be configured within or outside of the sliding window energy detector 1300 of FIG. 13. In one embodiment, one or both of the detection probability analyzer 1330 and the false alarm analyzer 1350 of FIG. 13 can be configured within (or outside) of the sliding window energy detector 1300. In another embodiment, both of the detection probability analyzer 1330 and the false alarm analyzer 1350 can be configured together as one unit.

In Step 1260 of FIG. 12, the test statistic can be compared with the testing threshold by the comparing unit 1360 of FIG. 13.

In Step 1270 of FIG. 12, detection can be declared by the declaring unit 1370 of FIG. 13, when the test statistics is greater than the testing threshold $\tau$, such that the sliding window energy detection has the minimum expected discrete detection time. When the test statistics is less than the testing threshold $\tau$, it is declared that there is no detection performed at current discrete time.

In one example, a sliding window energy detection with L=300 may use a testing threshold of 389.6. For a cumulative detection probability of 0.973 over time period 1 to K, an average detection time for the sliding window energy detection can be 171.8 over the time same period.

In another example, for sliding window energy detection with L=200, with a cumulative detection probability over time 1 to K of about 0.9609, the average detection time over the same time period can be 146.1.

The sliding window energy detection tests thus provide significantly reduced detection time. The sliding window energy detection can be suitable for constantly monitoring a spectrum channel for fast detection of signal presence under low SNR scenarios.

As such, performance of the energy detection is disclosed when used in a sliding window fashion for monitoring transmission signal activities in a frequency band. As disclosed, test statistics in the sliding window test are correlated over time, which complicates the design of the test and the evaluation of the testing performance. The present disclosure effectively analyzes the false alarm rate and the detection probability of the sliding window energy detection. With the same window length, the false alarm rate of the sliding window energy test and that of the independent test have a relationship that is almost linear. The distribution of the detection time is obtained for given window length and signal noise ratio, which allows the analysis and evaluation of the impact of window length on the performance of the sliding window test.

While the disclosure has been illustrated with respect to one or more implementations, alterations and/or modifications can be made to the illustrated examples without departing from the spirit and scope of the appended claims. In addition, while a particular feature of the disclosure may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising." The term "at least one of" is used to mean one or more of the listed items can be selected.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume values as defined earlier plus negative values, e.g. −1, −1.2, −1.89, −2, −2.5, −3, −10, −20, −30, etc.

Other embodiments of the disclosure will be apparent to those skilled in the art from consideration of the specification and practice of the disclosure disclosed herein. It is intended that the specification and examples be considered as exemplary only, with a true scope and spirit of the disclosure being indicated by the following claims.

What is claimed is:

1. A method for radio spectrum sensing using a sliding window energy detection, the method comprising:

obtaining, by a receiver of an energy detector, a preset cumulative false alarm rate for a sliding window energy detection test, the sliding window energy detection test comprising a number of continuously-performed tests;

determining, by the receiver, a single-time false alarm rate for the sliding window energy detection test based on the preset cumulative false alarm rate;

mapping a relationship between the single-time false alarm rate for the sliding window energy detection test and a false alarm rate for an independent energy detection test, having an independent, non-overlapping test window, under a condition with a same threshold and a same window length;

determining, by the receiver based on the mapped relationship, the false alarm rate for the independent energy detection test, having the independent, non-overlapping test window, corresponding to the single-time false alarm rate for the sliding window energy detection test; and obtaining, by the receiver, a testing threshold from the false alarm rate for the independent energy detection test having the independent, non-overlapping test window, wherein the obtained testing threshold yields the preset cumulative false alarm rate for the sliding window energy detection test.

2. The method of claim 1, wherein the receiver includes an antenna of a channel sensor, the method further comprising:

determining a target signal to noise ratio for a transmission signal received using antennas of a channel sensor for a sliding window energy detection process;

evaluating expected discrete detection times for a set of candidate discrete window lengths, according to the target signal to noise ratio and the obtained testing threshold that yields the preset cumulative false alarm rate for the sliding window energy detection test; and selecting a testing window length, whose expected discrete detection time has a minimum evaluated value, from the set of candidate discrete window lengths.

3. The method according to claim 2, further comprising:

setting a sampling rate based on a channel bandwidth for the transmission signal to provide a sampling interval, such that the continuously-performed tests of the sliding window energy detection test are performed at every sampling interval, and with any testing window length of the continuously-performed tests greater than one sampling interval, consecutive testing windows have overlaps for the sliding window energy detection test.

4. The method according to claim 1, further comprising:

mapping the relationship between the single-time false alarm rate under no transmission signal for the sliding window energy detection test and the false alarm rate under no transmission signal for the independent energy detection test under a condition with the same threshold and the same window length from a range of discrete window lengths, wherein:

$P_{FAs} = 1 - P(V[k] \leq \tau | V[k-1] \leq \tau)$, and $P_f = P(V > \tau | H_0)$ $P_{FAs}$ is the single-time false alarm rate, V[k] is test statistic of the energy detection at a discrete time [k], and k is a positive integer; and $P_f$ is the false alarm rate, $H_0$ is a situation that there is no transmission signal, and τ is a threshold used by the energy detector.

5. The method according to claim 4, wherein:
the mapped relationship comprises a substantially-linear relationship between the single-time false alarm rate ($P_{FAs}$) for the sliding window energy detection test and the false alarm rate ($P_f$) for the independent energy detection test.

6. The method according to claim 4, wherein:
the single-time false alarm rate ($P_{FAs}$) for the sliding window energy detection test is smaller than the false alarm rate ($P_f$) for the independent energy detection test by a reduction factor ranging from 1 to about 0.1, due to correlation of test statistics in the sliding window energy detection test.

7. The method according to claim 2, wherein:
the target signal to noise ratio includes a unit time signal energy to noise spectrum density ratio, obtained by an analysis over parameters including a channel bandwidth for the transmission signal, a signal power, and a two-sided noise power spectrum density.

8. The method according to claim 2, wherein:
the sliding window energy detection process is performed: during a transition from a situation having no transmission signal to a situation having the transmission signal, and under the situation having the transmission signal.

9. The method according to claim 2, further comprising:
determining detection probabilities of the sliding window energy detection test at discrete times for each discrete window length of the set of candidate discrete window lengths, under the target signal to noise ratio and the obtained testing threshold corresponding to the preset cumulative false alarm rate for the sliding window energy detection test.

10. The method according to claim 9, wherein:
for each candidate window length, after the transition from the situation having no transmission signal to the situation having the transmission signal, the detection probability increases as a signal-containing portion in a discrete testing window increases, and the detection probability reaches a peak value when the signal-containing portion fills a corresponding discrete window length.

11. The method according to claim 10, wherein:
after reaching a peak detection probability in one test of a sliding window energy detection test, the detection probability of a following test of the one test drops by an amount according to a correlation between the one test and the following test in the sliding window energy detection test.

12. The method according to claim 2, wherein the step of selecting the testing window length further comprises:
establishing a relationship between the expected discrete detection time and the candidate discrete window length under the target signal to noise ratio and the obtained testing threshold corresponding to the preset cumulative false alarm rate for the sliding window energy detection test; and
based on the established relationship, selecting the testing window length corresponding to the minimum expected discrete detection time.

13. A method for radio spectrum sensing using a sliding window energy detector, the method comprising:
receiving a transmission signal using antennas of a channel sensor having a channel bandwidth;
sampling, by a receiver of the sliding window energy detector, the transmission signal at a fixed sampling rate determined by the channel bandwidth, wherein the receiver includes the antennas;
obtaining a testing window length whose expected discrete detection time has a minimum value among a set of candidate discrete window lengths for a target signal to noise ratio for a sliding window energy detection test having a number of continuously-performed tests;
generating test statistic according to the testing window length by a test statistic generator configured in the sliding window energy detector;
obtaining a testing threshold based on the false alarm rate for an independent energy detection test having an independent, non-overlapping test window, corresponding to a preset cumulative false alarm rate for the sliding window energy detection test having the number of continuously-performed tests;
comparing the test statistic with the testing threshold; and
declaring detection, when the test statistics is greater than the testing threshold, wherein the sliding window energy detection process is performed having the minimum expected discrete detection time.

14. The method according to claim 13, wherein:
the fixed sampling rate is set based on the channel bandwidth to provide a sampling interval, such that the continuously-performed tests of the sliding window energy detection test are performed at every sampling interval, and
with any testing window length of the continuously-performed tests greater than one sampling interval, consecutive testing windows have overlaps for the sliding window energy detection test.

15. The method according to claim 13, wherein:
the target signal to noise ratio includes a unit time signal energy to noise spectrum density ratio, obtained by an analysis over parameters including a channel bandwidth for the transmission signal, a signal power, and a two-sided noise power spectrum density.

16. The method according to claim 13, wherein the step of obtaining the testing window length comprises:
performing the sliding window energy detection process during a transition from a situation having no transmission signal to a situation having the transmission signal, and under the situation having the transmission signal.

17. The method according to claim 13, wherein the step of obtaining the testing window length comprises:
establishing a relationship between expected discrete detection time and candidate discrete window length under the target signal to noise ratio and the testing threshold corresponding to the preset cumulative false alarm rate for the sliding window energy detection test, wherein based on the established relationship, the testing window length corresponding to the minimum expected discrete detection time is selected.

18. A sliding window energy detector connected to a channel sensor for radio spectrum sensing, the detector comprising:
a sampler, configured to sample a transmission signal from a channel sensor having a channel bandwidth at a fixed sampling rate determined by the channel bandwidth;

a detection probability analyzer, configured to provide a testing window length whose expected discrete detection time has a minimum value among a set of candidate discrete window lengths for a target signal to noise ratio for a sliding window energy detection test having a number of continuously-performed tests;

a testing statistic generator, configured to generate test statistic according to the testing window length;

a false alarm analyzer, configured to provide a testing threshold based on the false alarm rate for an independent energy detection test having an independent, non-overlapping test window, corresponding to a preset cumulative false alarm rate for the sliding window energy detection test having the number of continuously-performed tests;

a comparing unit, configured to compare the test statistic with the testing threshold; and a declaring unit, configured to declare detection when the test statistics is greater than the testing threshold, wherein a sliding window energy detection process is performed having the minimum expected discrete detection time.

19. The detector according to claim 18, wherein:

the fixed sampling rate is set based on the channel bandwidth to provide a sampling interval, such that the continuously-performed tests of the sliding window energy detection test are performed at every sampling interval, and with any testing window length of the continuously-performed tests greater than one sampling interval, consecutive testing windows have overlaps for the sliding window energy detection test.

20. The detector according to claim 18, wherein:

the sliding window energy detection process is performed during a transition from a situation having no transmission signal to a situation having the transmission signal, and under the situation having the transmission signal.

* * * * *